(12) United States Patent
Fei et al.

(10) Patent No.: US 12,381,572 B2
(45) Date of Patent: Aug. 5, 2025

(54) CURRENT DIGITAL-TO-ANALOG CONVERTER (DAC) WITH DIRECT-CURRENT (DC) OFFSET CORRECTION

(71) Applicant: QUALCOMM Incorporated, San Diego, CA (US)

(72) Inventors: Haibo Fei, San Diego, CA (US); Xiahan Zhou, San Diego, CA (US); Dongwon Seo, San Diego, CA (US); Parisa Mahmoudidaryan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 237 days.

(21) Appl. No.: 18/335,663

(22) Filed: Jun. 15, 2023

(65) Prior Publication Data

US 2024/0421828 A1    Dec. 19, 2024

(51) Int. Cl.
| | |
|---|---|
| *H03M 1/78* | (2006.01) |
| *H03M 1/10* | (2006.01) |
| *H03M 1/06* | (2006.01) |
| *H03M 1/74* | (2006.01) |

(52) U.S. Cl.
CPC .......... *H03M 1/785* (2013.01); *H03M 1/1023* (2013.01); *H03M 1/06* (2013.01); *H03M 1/0617* (2013.01); *H03M 1/74* (2013.01)

(58) Field of Classification Search
CPC ...... H03M 1/785; H03M 1/1023; H03M 1/06; H03M 1/0617
See application file for complete search history.

(56) References Cited

U.S. PATENT DOCUMENTS 11,817,873 B1 * 11/2023 Babaee ................ H03M 1/742
2006/0007029 A1    1/2006 Ito

OTHER PUBLICATIONS

Cong Y., et al., "A 1.5-V 14-Bit 100-MS/s Self-calibrated DAC", IEEE Journal of Solid-state Circuits, IEEE, USA, vol. 38, No. 12, Dec. 1, 2003, pp. 2051-2060, XP001221454, figure 7.
International Search Report and Written Opinion—PCT/US2024/026031—ISA/EPO—Aug. 30, 2024.
Shen M.H., et al., "A Low Cost Calibrated DAC for High-Resolution Video Display System", IEEE Transactions on Very Large Scale Integration (VLSI) Systems, IEEE Service Center, Piscataway, NJ, USA, vol. 20, No. 9, Aug. 4, 2011, pp. 1743-1747, XP011455656, sections II-B, II.C, III, figures 1,4.

* cited by examiner

*Primary Examiner* — Joseph J Lauture
(74) *Attorney, Agent, or Firm* — Patterson + Sheridan, L.L.P.

(57) ABSTRACT

Certain aspects of the present disclosure provide a digital-to-analog converter (DAC) circuit. The DAC circuit generally includes: a decoder coupled to an input of the DAC circuit and current-steering cells coupled to an output of the decoder. Outputs of the current-steering cells may be coupled to a positive output node and a negative output node of the DAC circuit. The DAC circuit may also include an offset detection circuit including: a comparator having a first input and a second input selectively coupled to the positive output node and the negative output node; and a digital controller having an input coupled to an output of the comparator and an output coupled to the decoder. In some aspects, the DAC circuit includes one or more calibration DACs coupled to the offset detection circuit.

25 Claims, 12 Drawing Sheets

CURRENT DIGITAL-TO-ANALOG CONVERTER (DAC) WITH DIRECT-CURRENT (DC) OFFSET CORRECTION

BACKGROUND

Field of the Disclosure

Certain aspects of the present disclosure generally relate to electronic circuits and, more particularly, to techniques and circuitry for digital-to-analog conversion.

Description of Related Art

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include transmitters for processing signals for transmission via antennas. A transmitter may include one or more digital-to-analog converters (DACs) configured to convert signals from the digital domain to the analog domain for further processing (e.g., amplification) prior to transmission.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure are directed towards a digital-to-analog converter (DAC) circuit. The DAC circuit generally includes: a decoder coupled to an input of the DAC circuit; current-steering cells coupled to an output of the decoder, wherein outputs of the current-steering cells are coupled to a positive output node and a negative output node of the DAC circuit; and an offset detection circuit may include: a comparator having a first input and a second input selectively coupled to the positive output node and the negative output node; and a digital controller having an input coupled to an output of the comparator and an output coupled to the decoder; and one or more calibration DACs coupled between the offset detection circuit and one or more of the current-steering cells.

Certain aspects of the present disclosure are directed towards a method for digital-to-analog conversion. The method generally includes: receiving an output signal from a comparator having a first input and a second input selectively coupled to a positive output node and a negative output node of a DAC circuit, wherein outputs of a plurality of current-steering cells are coupled to the positive output node and the negative output node; determining, via a digital controller, one or more calibration DAC signals associated with one or more direct-current (DC) offsets of the DAC circuit based on the output signal from the comparator; generating, via one or more calibration DACs, one or more currents provided to at least one of the plurality of current-steering cells based on the one or more calibration DAC signals; and generating an analog signal via the plurality of current-steering cells while the one or more currents are being provided to the plurality of current-steering cells.

Certain aspects of the present disclosure are directed towards an apparatus for digital-to-analog conversion. The apparatus generally includes: means for determining one or more calibration DAC signals associated with one or more DC offsets of a DAC circuit based on an output signal from a comparator, the comparator having a first input and a second input selectively coupled to a positive output node and a negative output node of the DAC circuit, where outputs of a plurality of current-steering cells of the DAC circuit are coupled to the positive output node and the negative output node; and means for generating one or more currents to be provided to at least one of the plurality of current-steering cells based on the one or more calibration DAC signals, where the current-steering cells are configured to generate an analog signal while the one or more currents are provided to the plurality of current-steering cells.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to techniques for digital-to-analog conversion. For example, certain aspects provide a digital-to-analog converter (DAC) circuit implemented with current steering. The DAC circuit may include a current-steering DAC, circuitry for detecting a direct-current (DC) offset of the DAC, and circuitry for correcting (or at least reducing) the DC offset, increasing the accuracy of the DAC. For example, a DC offset may be detected using a comparator and logic for performing a binary search algorithm (e.g., a successive approximation register (SAR) algorithm). In some cases, a DC offset associated with the comparator may also be detected and corrected (or at least reduced).

Example Wireless Communications

Figure 1:
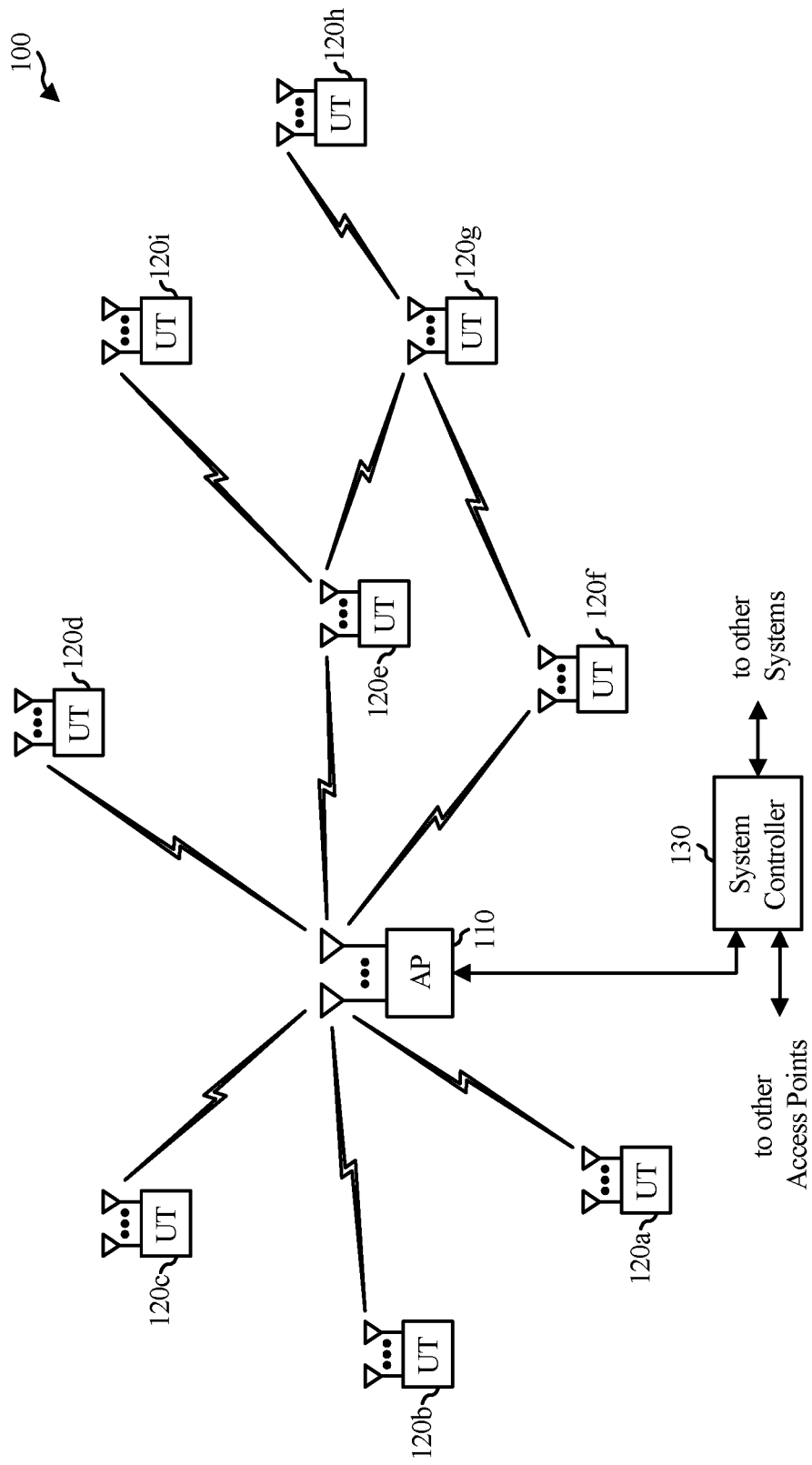
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set Nu of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The Nu selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In some aspects, the user terminal 120 or access point 110 may include a digital-to-analog converter (DAC) circuit implemented with current-steering cells and circuitry for offset detection and correction, as described in more detail herein.

Figure 2:
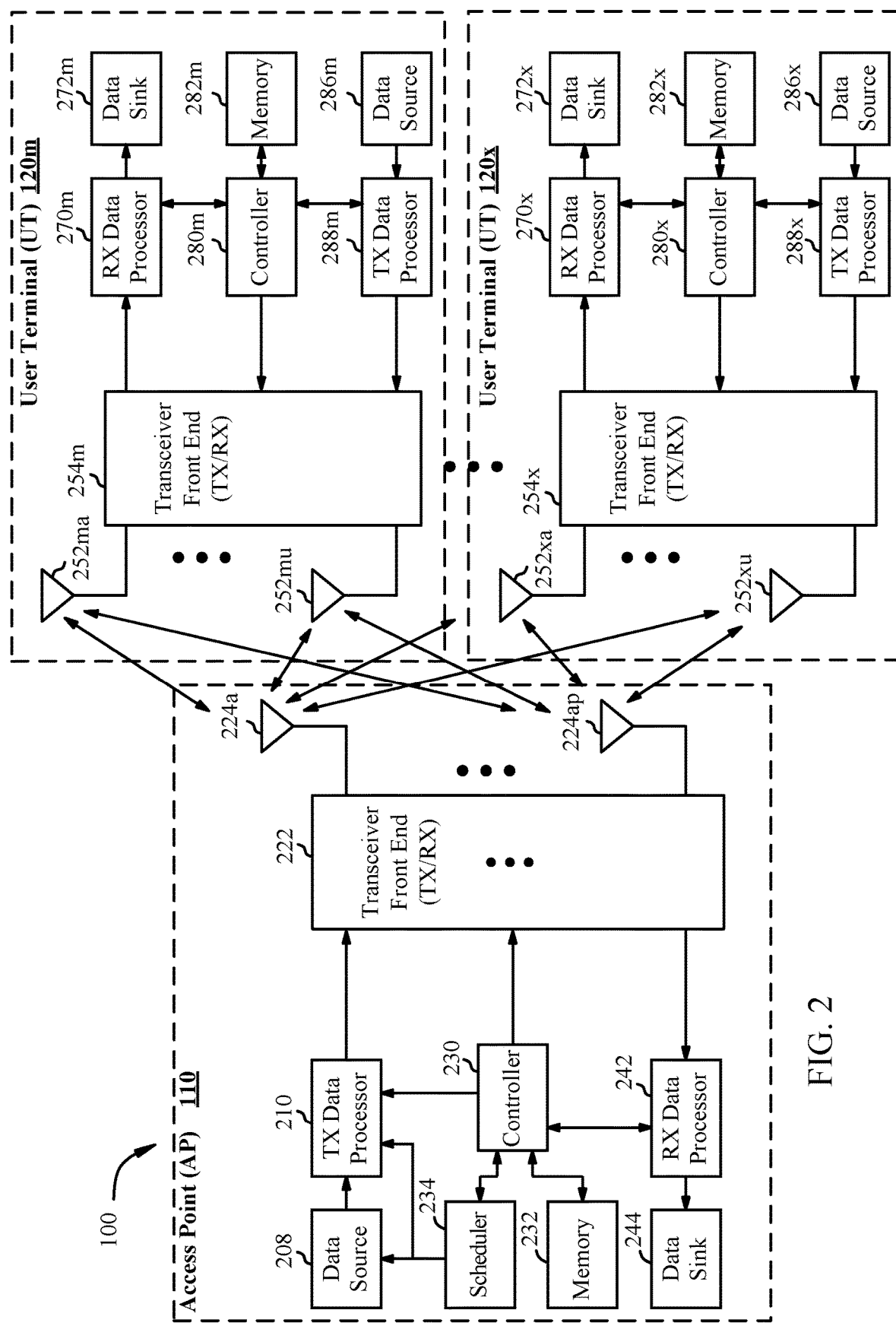
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to Nan, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data {dup} for the user terminal based on the coding and modulation schemes associated with the rate selected for the user terminal and provides a data symbol stream {Sup} for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream {Sup} transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. In some aspects, the transceiver front end 254 or 222 may include a DAC circuit implemented with current-steering cells and circuitry for offset detection and correction, as described in more detail herein.

Figure 3:
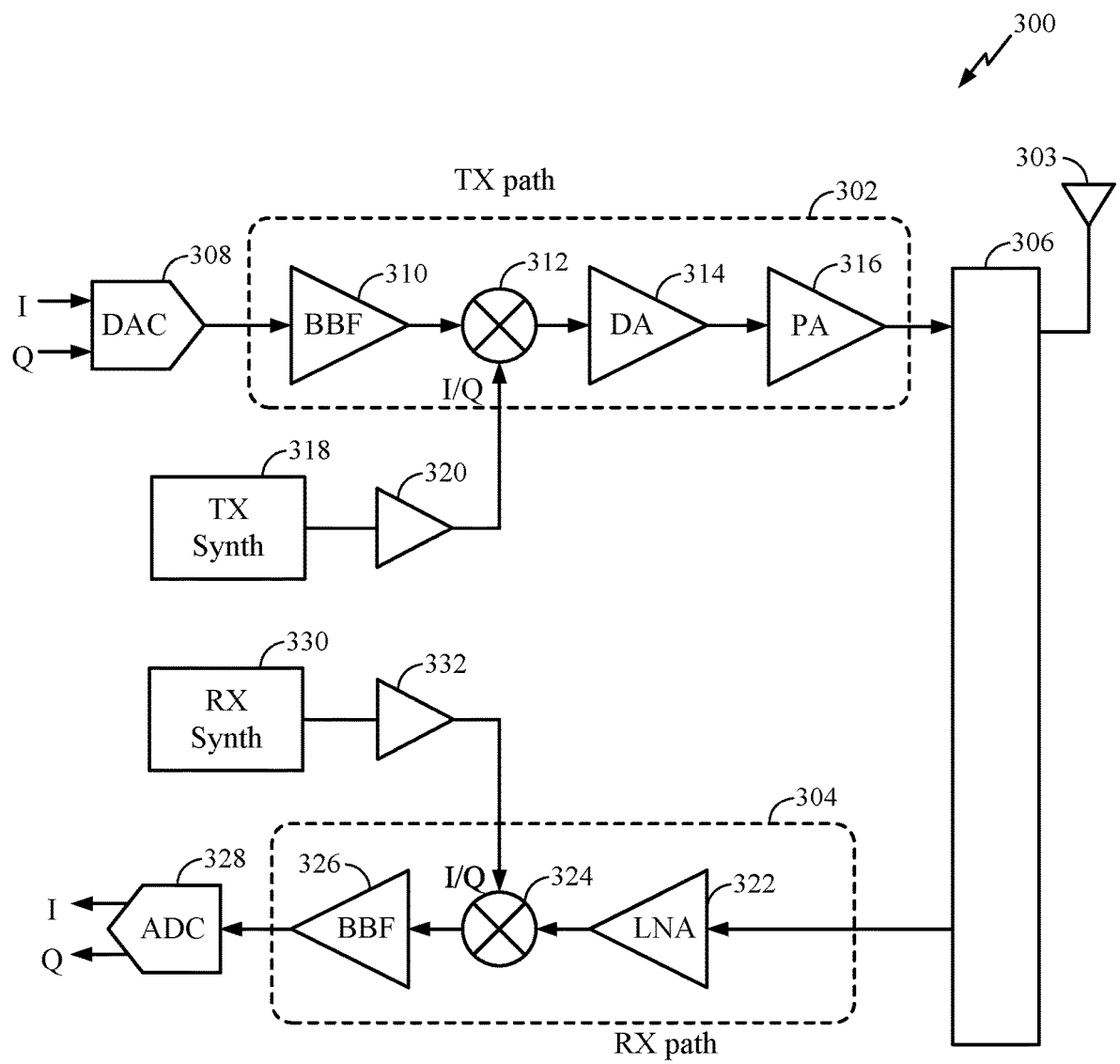
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. In some aspects, the DAC 308 may be implemented with current-steering cells and circuitry for offset detection and correction, as described in more detail herein. The BBF 310, the mixer 312, and the DA 314 may be included in a radio frequency integrated circuit (RFIC), while the PA 316 may be external to the RFIC.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide wireless communications as an example application in which certain aspects of the present disclosure may be implemented to facilitate understanding, certain aspects described herein may be used for digital-to-analog conversion in any of various other suitable systems (e.g., an audio system or other electronic system).

Digital-to-Analog Conversion Using Current Steering

Current-steering digital-to-analog converters (DACs) are one example architecture for high performance digital-to-analog conversion in many wireless transmitters. Current-steering DACs offer versatility of design, high-speed operation, and high performance. The current-steering DAC may be used in a transmit path due to the high speed associated with the DAC. A current-steering DAC may provide a positive output current (e.g., referred to herein as "Ipos" or "Ip") and a negative output current (e.g., referred to herein as "Ineg" or "Im"). A direct-current (DC) offset at the output of the DAC may impact system specifications such as carrier suppression and/or local oscillator (LO) leakage.

Figure 4:
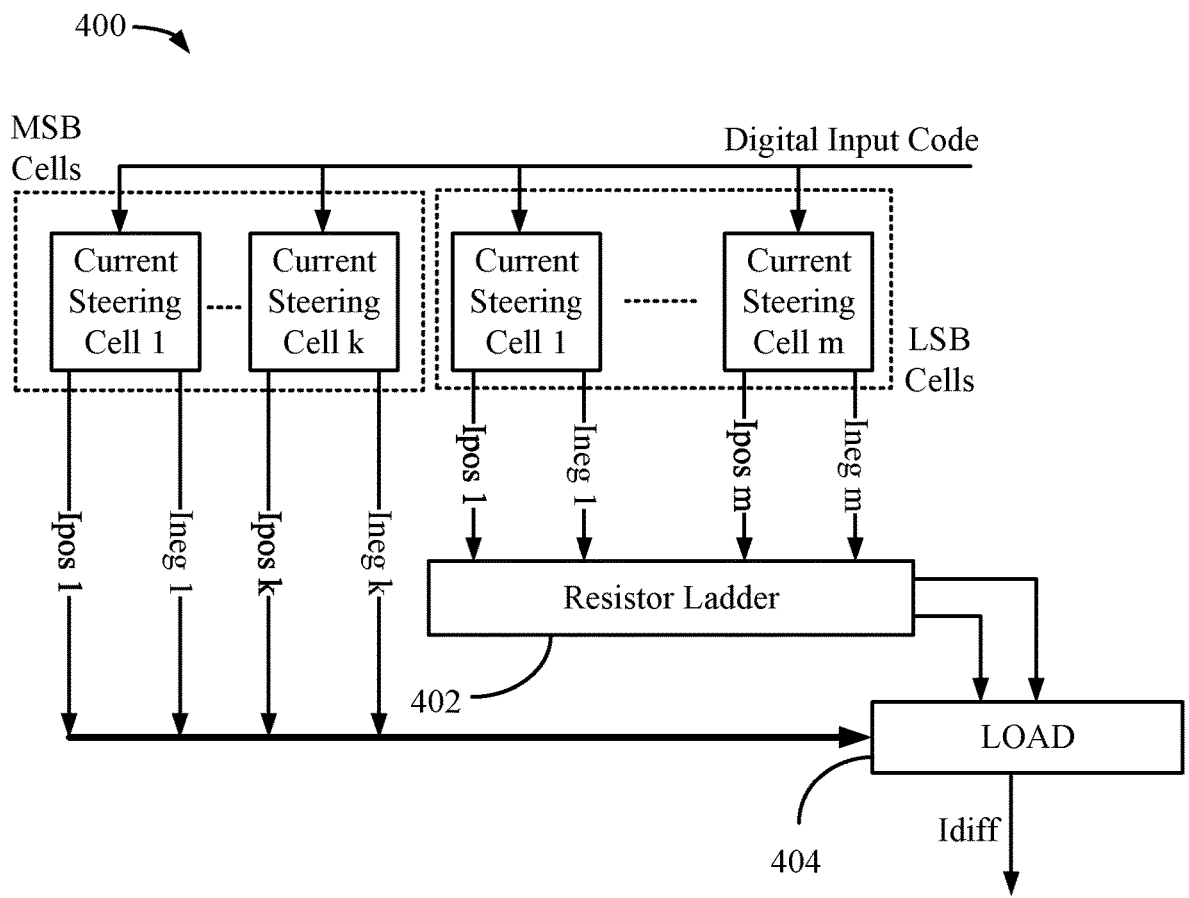
FIG. 4 illustrates an example digital-to-analog converter (DAC), in accordance with certain aspects of the present disclosure.
Figure 5:
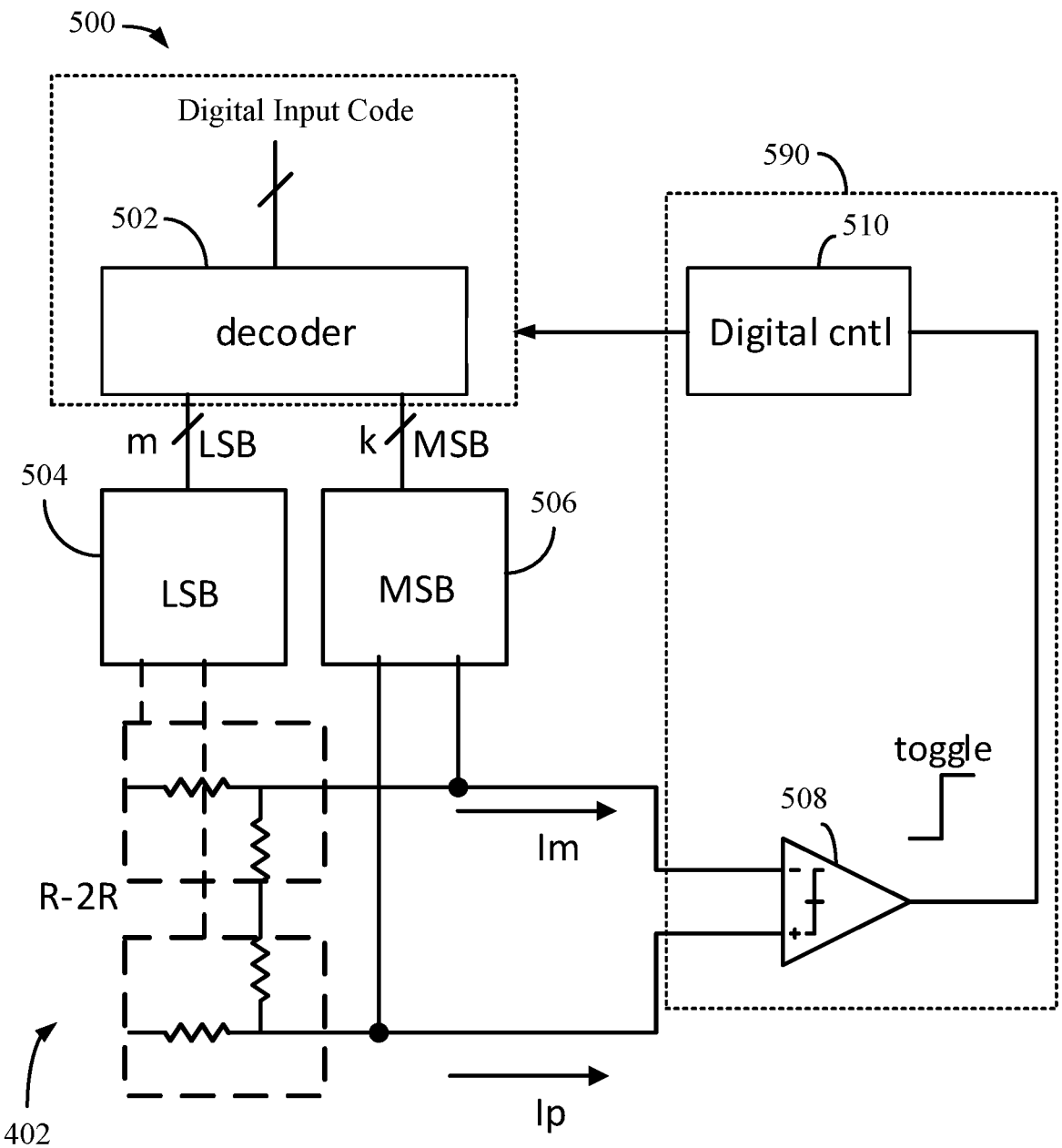
FIGS. 5 and 6 illustrate example DAC circuits with circuitry for offset detection, in accordance with certain aspects of the present disclosure.

FIG. 4 illustrates an example current-steering DAC 400 (e.g., implemented as the DAC 308 of FIG. 3), in accordance with certain aspects of the present disclosure. Depending on a digital input code, each bit of the DAC 400 associated with a current-steering cell may source a positive current (e.g., Ipos 0 to Ipos k, k being an integer greater than 1, and Ipos 1 to Ipos m, m being an integer greater than 1) or a negative current (e.g., Ineg 1 to Ineg k, and Ineg1 to Ineg m) to respective outputs depending on the logic level for a respective bit of the digital input code. The DAC 400 may include most significant bit (MSB) cells (e.g., including current-steering cells 1-k) and least significant bit (LSB) cells (e.g., including current-steering cells 1-m). Each of the current-steering cells may include switches to selectively provide a positive or negative current from each respective cell. In some cases, the positive and negative currents from the LSB cells may be provided to a resistor ladder circuit 402 to implement different weights for the different LSB bits. For example, the resistor ladder circuit 402 may be implemented as an R-2R ladder (as illustrated in FIG. 5, where each resistor shown has a resistance of R). The positive and negative currents may be provided to a load 404 (e.g., the baseband filter (BBF) 310).

For future generations of mobile chip sets, the specification for DAC DC offset may become stricter to improve wireless device efficiency. DC offset may be mainly associated with circuitry used to implement the current-steering DAC. Certain aspects of the present disclosure are directed to techniques and apparatus for detecting and correcting, or at least reducing, DAC DC offset. For DAC DC offset detection, a current comparator and switches may be used to measure the DC offset, as described in more detail herein. For DC offset correction (or reduction), calibration DAC (CALDAC) circuitry may be used for MSB current-steering cell calibration. For example, DC offset correction may be implemented by injecting an unbalanced current to all or selected MSB current-steering cells to correct, or at least reduce, the DAC DC offset, as described in more detail herein.

FIG. 5 is a block diagram of an example current-steering DAC circuit 500 with circuitry for DC offset detection, in accordance with certain aspects of the present disclosure. As shown, the DAC circuit 500 may include a decoder 502 receiving a digital input code and controlling current-steering switches of LSB current-steering cells 504 and MSB current-steering cells 506 based on the digital input code.

For DC offset detection, the DAC circuit 500 may be implemented with an offset detection circuit 590 which may include a current comparator 508 receiving a positive current (e.g., $I_p$) and a negative current ($I_m$) from the current-steering cells. The current comparator 508 may provide a logic high output when $I_p$ is greater than $I_m$, and a logic low output when $I_p$ is less than $I_m$.

The offset detection circuit 590 may also include a digital controller 510 receiving an output signal of the comparator 508. The digital controller 510 may control the decoder 502 (or the digital input code to the decoder 502) based on the output signal of the comparator 508. Based on the output signal from the comparator 508, the digital controller 510 may determine one or more DC offsets using successive approximation (a binary search algorithm), as described in more detail herein.

The DAC circuit 500 may include k-bit thermometer code MSB cells and m-bit binary code LSB cells. In an ideal case (e.g., when there is no DC offset for the DAC circuit 500), when the digital input code is 01 . . . 111b (e.g., a mid-code), $I_m$ may be calculated based on the following equation:

$$I_m = 2^{(k-1)} I_{msb}$$

and $I_p$ may be calculated based on the following equation:

$$I_p = 2^{(k-1)} I_{msb} - I_{lsb\_diff}/2$$

where $I_{msb}$ is the MSB current associated with the 1-bit range of the MSB cells and $I_{lsb\_diff}$ is the LSB differential current associated with the 1-bit range of the LSB cells. Thus, assuming an ideal DAC (e.g., without DC offset), the difference between $I_p$ and $I_m$ ($\Delta I$) may be equal to $-I_{lsb\_diff}/2$ for digital input code 01 . . . 111b, resulting in the output of the comparator 508 being logic low. If the digital input code increases by 1 (e.g., from 01 . . . 111b to 100 . . . 000b), $\Delta I$ may be equal to $+I_{lsb\_diff}/2$, and the output of the comparator toggles from logic low to logic high. In this case, 100 . . . 000b may be referred to as a "toggle point" for the comparator.

Figure 6:
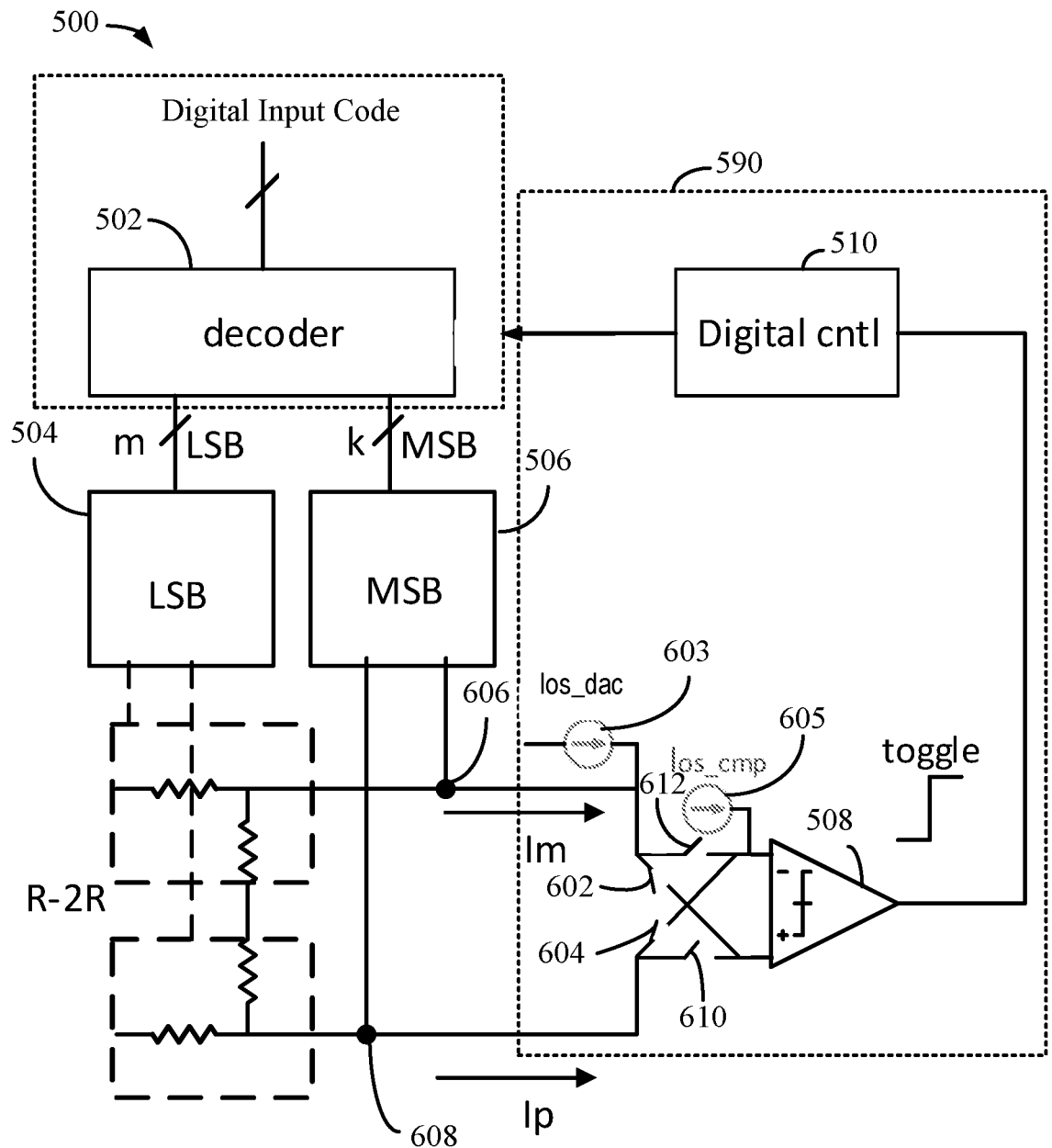

FIG. 6 is a block diagram of the example current-steering DAC circuit 500 implemented with switches for identifying a DC offset, in accordance with certain aspects of the present disclosure. As shown, the current-steering DAC may include a DAC offset current ($I_{os\_dac}$) represented by current source 603 and a comparator offset current ($I_{os\_cmp}$) (e.g., an offset associated with the comparator 508) represented by current source 605. In this case, $\Delta I$ may be equal to $-I_{lsb\_diff}/2 + I_{os\_dac} + I_{os\_cmp}$ at the mid-code (01 . . . 111b).

If normalizing the offsets (e.g., $I_{os\_dac}$ and $I_{os\_cmp}$) with respect to $I_{lsb}$, then $\Delta I$ may be equal to:

$$\Delta I = \frac{-I_{lsb\_diff}}{2} + (N \times I_{lsb}) + (M \times I_{lsb})$$

where N is a positive integer and M is a positive integer. The digital controller 510 may determine a first digital input code (e.g., $code_1$) as being the toggle point of the comparator 508 (e.g., using successive approximation). The comparator 508 may toggle when $code_1$ is equal to $$100 \ldots 0\underbrace{1..1}_{N}\underbrace{1..1}_{M}$$

(e.g., assuming a thermometer code). In other words, a first portion of the least significant bits of the first digital input code may represent N, and a second portion of the least significant bits of the first digital input code may represent M.

In some aspects, a switch 602 may be coupled between a negative output node 606 of the current-steering cells 506 and a positive input of the comparator 508. A switch 604 may be coupled between a positive output node 608 of the current-steering cells 506 and a negative input of the comparator 508. A switch 610 may be coupled between the positive output node 608 and the positive input of the comparator 508, and a switch 612 may be coupled between the negative output node 606 and the negative input of the comparator 508. When determining code$_1$, switches 610, 612 may be closed, while switches 602, 604 may be open.

Once code$_1$ has been determined, switch 612 may be opened, switch 602 may be closed, switch 604 may be closed, and switch 610 may be opened, in effect coupling the negative output node 606 to the positive input of the comparator 508 and coupling the positive output node 608 to the negative input of the comparator 508. Then, at mid-code (01 . . . 111b), ΔI may be equal to:

$$\Delta I = \frac{-I_{lsb\_diff}}{2} + (N \times I_{lsb}) - (M \times I_{lsb})$$

Using successive approximation, the digital controller 510 may determine a second digital input code (e.g., code$_2$) as being the toggle point of the comparator 508. That is, the comparator 508 may toggle when code$_2$ is equal to $$100 \ldots 0 \underbrace{1..1}_{(N-M)}.$$

In other words, the least significant bits may represent N minus M.

In some aspects, the first digital input code (code$_1$) and the second digital input code (code$_2$) may be stored. The integer N indicating the DAC offset ($I_{os\_dac}$) and the integer M indicating the comparator offset ($I_{os\_comp}$) may be calculated as follows:

$$I_{os\_dac} = \frac{code_1 + code_2}{2} = \frac{N+M+N-M}{2} = N$$

$$I_{os\_comp} = \frac{code_1 - code_2}{2} = \frac{N+M-(N-M)}{2} = M$$

Figure 7A:
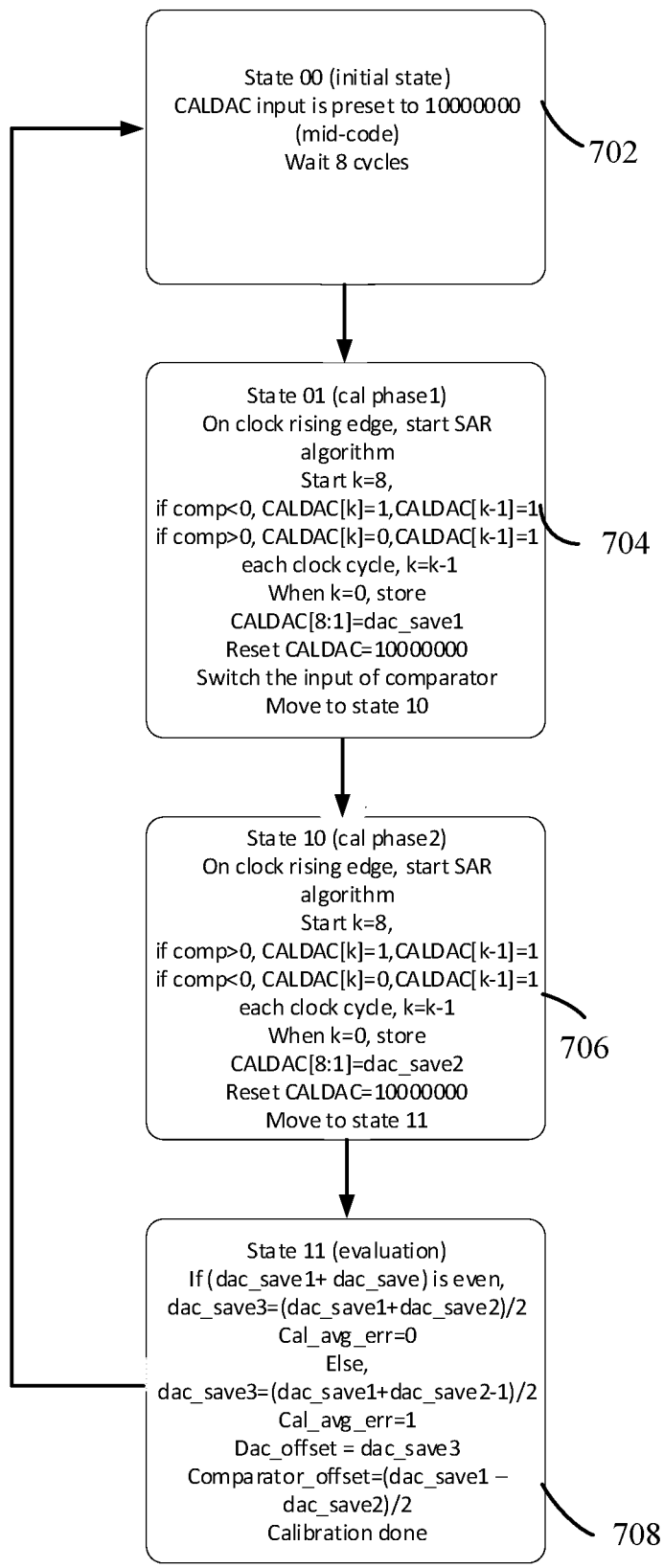
FIGS. 7A and 7B illustrating example binary search operations performed by a successive approximation register (SAR) algorithm for DC offset detection, in accordance with certain aspects of the present disclosure.
Figure 7B:
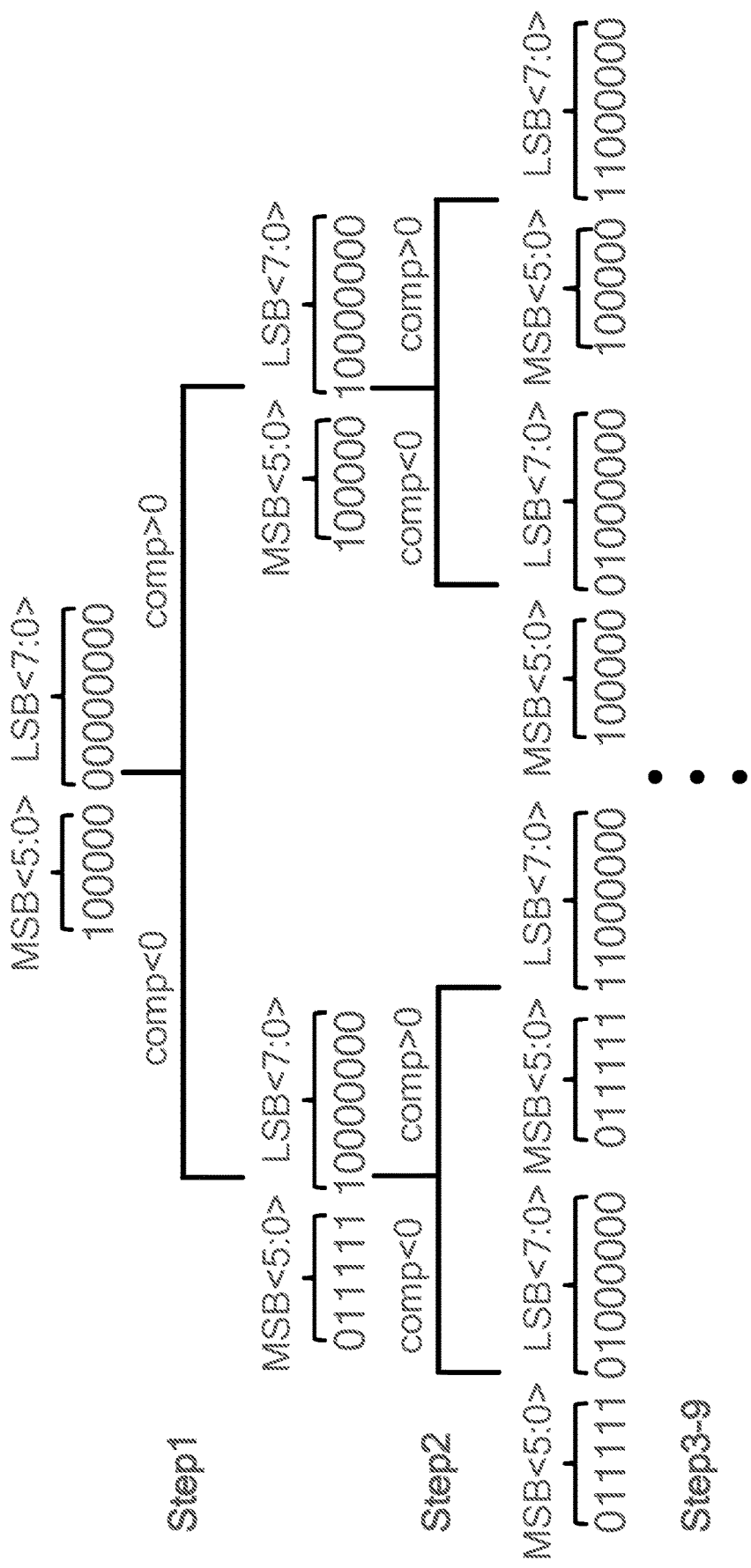

FIG. 7A is a state diagram illustrating example binary search operations (e.g., a SAR algorithm) for identifying the first digital input code (code$_1$) and the second digital input code (code$_2$), in accordance with certain aspects of the present disclosure. FIG. 7B illustrates successive changes to a digital input code used to identify code$_1$ and code$_2$ using the search operations. The search operations described with respect to FIG. 7A and FIG. 7B may be performed via the digital controller 510.

As described, the positive output node 608 may be coupled to the positive input of the comparator 508 by closing switch 610, and the negative output node 606 may be coupled to the negative input of the comparator 508 by closing switch 612. At block 702 (e.g., state 00) shown in FIG. 7A, a CALDAC input (CALDAC[k]) having k bits (e.g., 8 bits) may be preset to 10000000b (e.g., midcode). In some aspects, after k (=8) clock cycles of the DAC, the operations proceed to state 01. At block 704 (e.g., state 01), on a rising edge of the DAC clock and starting at k equals 8 (starting with the eighth bit of CALDAC[k]), the digital input code to the DAC may be set to 100000000000000b. For example, as shown in FIG. 7B, 6 MSBs (e.g., a 6-bit binary code) may be used to control the 63 MSB current steering cells. The 6-bit binary code may be set to 100000b, and the 8 LSBs of the digital input code may be set to 00000000b.

If the output of the comparator 508 is logic low (e.g., −1), CALDAC [k] may be set to 1, and CALDAC [k−1] may be set to 1. In other words, CALDAC [k] may be set to 11000000b. Moreover, the MSBs of the digital input code may be set to 011111b, and the LSBs of the digital input code may be set to 10000000b, as shown in FIG. 7B. If the output of the comparator 508 is logic high (e.g., +1), CALDAC [k] is set to 0, and CALDAC [k−1] is set to 1. In other words, CALDAC [k] may be set to 01000000b. Moreover, the MSBs of the digital input code may be set to 100000b, and the LSBs of the digital input code may be set to 10000000b. As shown in FIG. 7B, for a subsequent clock cycle, k is decremented (e.g., k=k−1). If the output of the comparator 508 is logic low, CALDAC [k] may be set to 1, CALDAC [k−1] may be set to 1, and the LSBs of the digital input code may be set to 01000000b, as shown in FIG. 7B. If the output of comparator 508 is logic high, CALDAC [k] is set to 0, CALDAC [k−1] is set to 1, and the LSBs of the digital input code may be set to 11000000. After each clock cycle, k is decremented (e.g., k=k−1), and the process is repeated until k reaches zero and all bits of CALDAC [k] are determined.

CALDAC [k] is then saved (e.g., as "dac_save1," corresponding to code$_1$ described herein). CALDAC [k] may be reset to 10000000b, and the comparator input may be switched by controlling switches 602, 604, 610, 612. For example, the negative output node 606 may be coupled to the positive input of the comparator 508 by closing switch 602, and the positive output node 608 may be coupled to the negative input of the comparator 508 by closing switch 604. At block 706, the operations described with respect to state 01 may be repeated to derive another value for CALDAC [k] which may be saved (e.g., as "dac_save2," corresponding to code, described herein).

At block 708, it may be determined whether dac_save1 plus dac_save2 is even. If dac_save1 plus dac_save2 is even, the calibration average error (e.g., referred to as "cal_avg_err") may be determined to be zero (e.g., the DC offset associated with the comparator 508 may be zero). Moreover, a digital signal (dac_save3) may be calculated as (dac_save1+dac_save2)/2. If dac_save1 plus dac_save2 is odd, dac_save3 may be calculated as (dac_save1+dac_save2-1)/2, and the calibration average error may be determined as 1.

The DAC offset (e.g., referred to as "dac_offset") may be equal to dac_save3. Moreover, the comparator offset (e.g., referred to as "comparator_offset") may be equal to (dac_save1-dac_save2)/2. The determined dac_offset and comparator_offset may be used to provide an unbalanced current to one or more current-steering cells for DC offset correction, as described in more detail herein.

Figure 8:
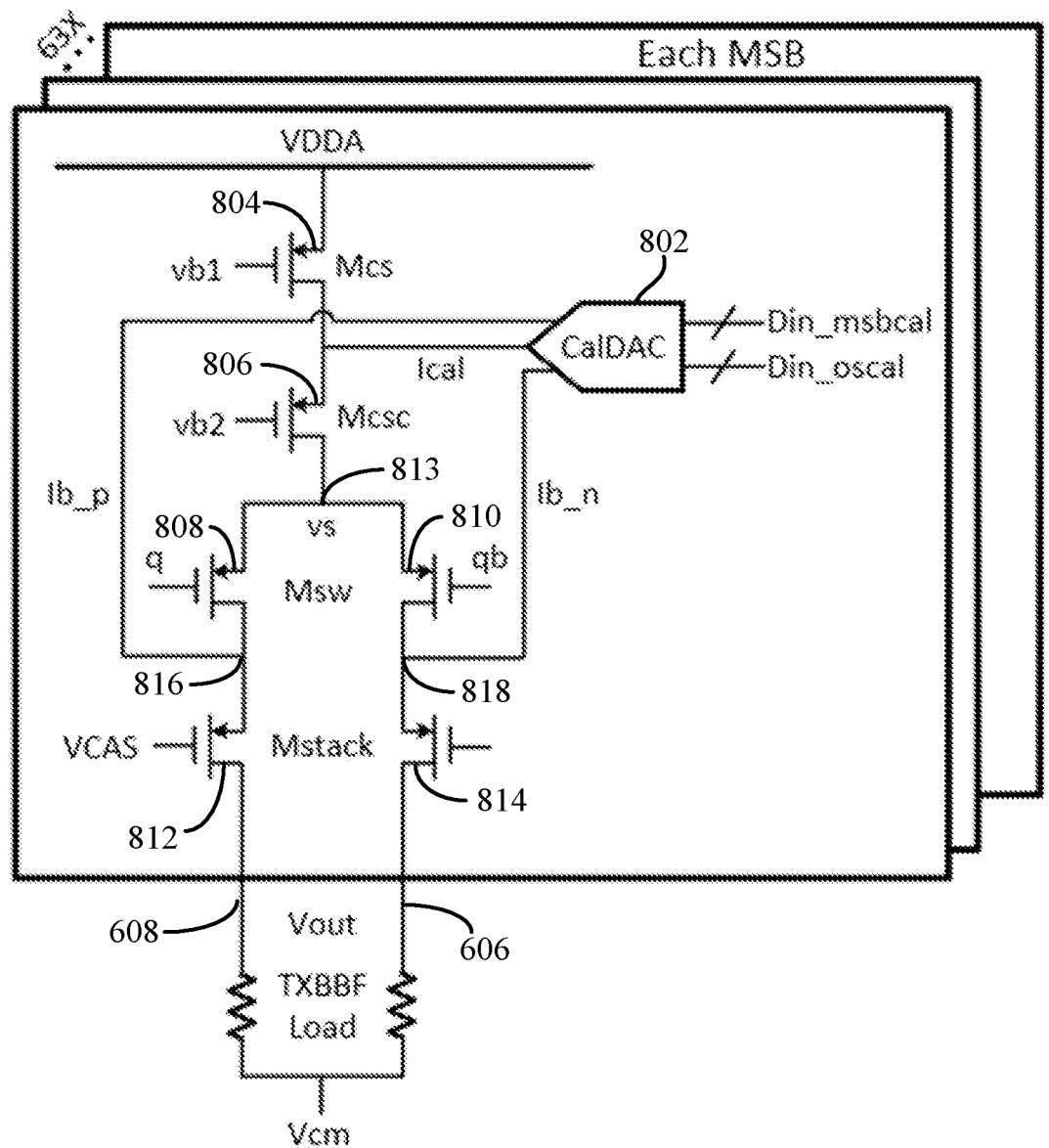
FIG. 8 illustrates most significant bit (MSB) current-steering cells implemented with calibration DACs, in accordance with certain aspects of the present disclosure.

FIG. 8 illustrates MSB current-steering cells of a DAC circuit, each cell implemented with a calibration DAC (e.g., calibration DAC 802), in accordance with certain aspects of the present disclosure. The calibration DAC 802 may receive a MSB calibration digital input (e.g., labeled "Din_msbcal") and an offset calibration digital input (e.g., labeled "Din_oscal"). Din_oscal may be set based on the DAC offset and comparator offset, described herein. Once the offsets associated with the DAC and comparator are measured as described with respect to FIGS. 7A and 7B, the calibration DACs of the MSB current-steering cells may inject unbalanced current (e.g., a positive current (Ib_p) and a negative current (Ib_n) that are not equal) into cascode nodes of the cells to correct, or at least reduce, the offsets.

Half the range of each calibration DAC may be used for MSB calibration controlled by Din_msbcal, and the other half of the range of each calibration DAC may be used for DC offset calibration controlled by Din_oscal. In some aspects, the full range of the calibration DAC may be programmable.

As shown, each current-steering cell may include current-steering switches 808, 810 having sources coupled to a current-steering node 813. Transistors 804, 806 may be biased and used to source current to the current-steering node 813, which may be steered either to the positive output node 608 or the negative output node 606 by controlling current-steering switches 808, 810. In some aspects, the current-steering switch 808 may be coupled in cascode with transistor 812, and the current-steering switch 810 may be coupled in cascode with transistor 814, which may be biased with a cascode bias voltage (labeled "VCAS"). As shown, the calibration DAC 802 may provide Ib_p to a cascode node 816 and Ib_n to a cascode node 818, based on Din_oscal. In some aspects, the calibration DAC 802 may provide a calibration current (Ical) to a node coupled to a drain of transistor 804 and a source of transistor 806 in the current source, as shown.

Figure 9A:
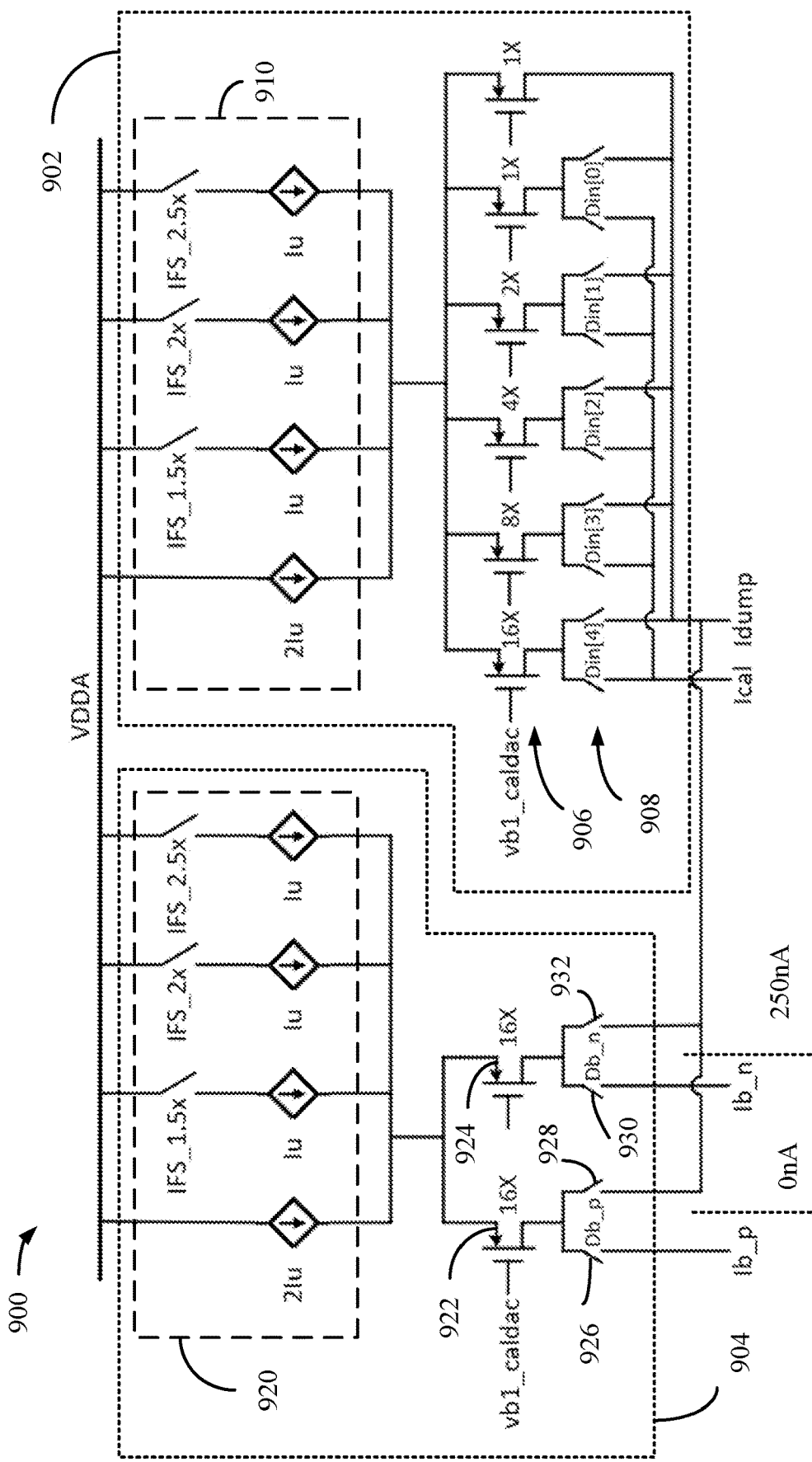
FIGS. 9A and 9B illustrate example implementations of calibration DACs, in accordance with certain aspects of the present disclosure.

FIG. 9A illustrates an example implementation of a calibration DAC 900 (e.g., corresponding to calibration DAC 802), in accordance with certain aspects of the present disclosure. The calibration DAC 900 includes calibration circuitry 902 for generating Ical and calibration circuitry 904 for generating Ib_p and Ib_n. As shown, calibration circuitry 902 may include current source circuitry 910 configured to source current to transistors 906. As shown, transistors 906 may have different sizes (e.g., 1× to 16×), allowing different currents to be sourced to current-steering switches 908. In other words, the transistor labeled "2×" may be twice the size of (e.g., source twice the current of) the transistor labeled "1×," and so on. Thus, the current-steering switches 908 may be controlled to provide a set calibration current (Ical), as shown.

Similarly, the calibration circuitry 904 may include current source circuitry 920 sourcing current to transistors 922, 924, which may have the same size (e.g., 16X). Thus, each of transistors 922, 924 may source the same amount of current to respective current-steering switches. Current-steering switches 926, 928 may be controlled to set Ib_p, and current-steering switches 930, 932 may be controlled to set Ib_n.

In some aspects, only a subset of MSB calibration DACs (e.g., calibration DACs of MSB current-steering cells) may provide unbalanced current. As one example, to calibrate an offset of 1 μA. 4 MSB calibration DACs (e.g., of the total 63 MSB calibration DACs in this example) may be configured to provide unbalanced current. For example, each of the four MSB calibration DACs may be configured to provide Ib_p of zero by opening switch 926 and closing switch 928, and provide Ib_n of 250 nA by closing switch 930 and opening switch 932, as shown in FIG. 9A. The 59 other MSB calibration DACs may provide a balanced current (e.g., Ib_n of 250 nA and Ib_p of 250 nA).

Figure 9B:
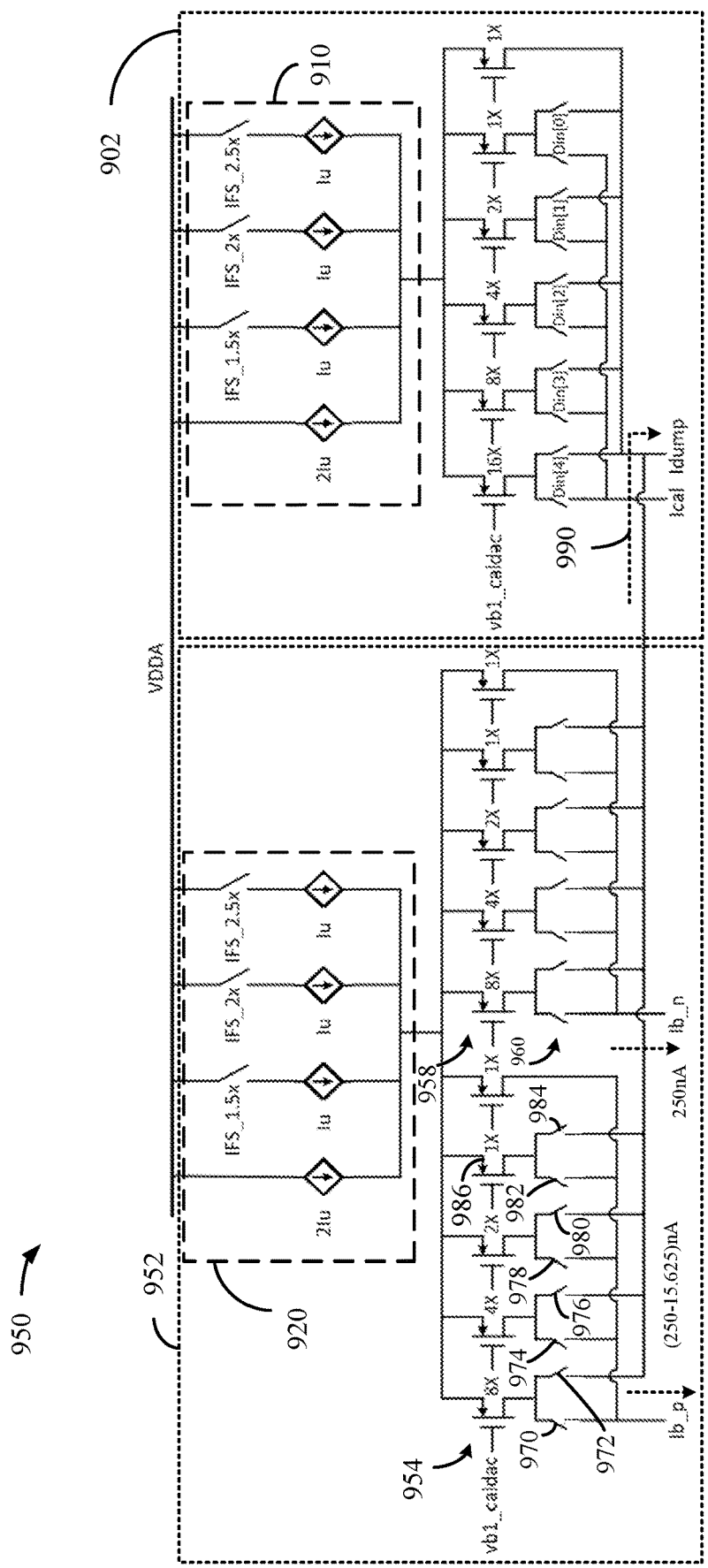

FIG. 9B illustrates an example implementation of a calibration DAC 950 (e.g., corresponding to calibration DAC 802), in accordance with certain aspects of the present disclosure. As shown, the calibration DAC 950 may include calibration circuitry 952 for generating Ib_p and Ib_n. The calibration circuitry 952 may include transistors 954 of different sizes (e.g., 1×, 2×, 4×, and 8×) coupled to respective current-steering switches for generating Ib_p and transistors 958 of different sizes (e.g., 1×, 2×, 4×, and 8×) coupled to respective current-steering switches 960 for generating Ib_n. As an example, to calibrate an offset of roughly 1 μA, all 63 MSB calibration DACs may be configured to provide Ib_p of 250 nA and an Ib_n of (250-15.625) nA. For instance, the Ib_n of (250-15.625) nA may be provided by closing switches 970, 974, 978, 984 (e.g., dumping current from transistor 986 using current dump path 990) and opening switches 972, 976, 980, 982. Thus, each of the 63 MSB calibration DAC contributes an amount of unbalance between Ib_p and Ib_n of 15.625 nA, resulting in an offset correction of 984 nA (e.g., 63×15.625 nA equals 984 nA).

The calibration DAC 900 described with respect to FIG. 9A provides a larger DC offset correction step, but with fewer components as compared to the calibration DAC 950 described with respect to FIG. 9B. The calibration DAC 900 provides an offset correction step size of 250 nA, whereas the calibration DAC 950 provides an offset correction step size of 15.625 nA.

DC offset detection techniques described herein effectively detect the DC offset with lower hardware overhead and calibration time (e.g., less than or equal to 16 calibration cycles) as compared to at least some conventional implementations. DC offset correction uses CALDACs to inject an unbalanced correction current to fix (or at least reduce) the DC offset associated with the DAC. A residual DC offset may remain depending on the CALDAC resolution (e.g., step size), current comparator noise, and mismatch between the CALDACs. The techniques described herein may also help to stabilize cascode nodes (e.g., cascode nodes 816, 818) during switching. Certain aspects of the present disclosure neither take up substantial extra die area nor consume much additional power as compared to at least some conventional implementations.

Example Operations for Digital-to-Analog Conversion

Figure 10:
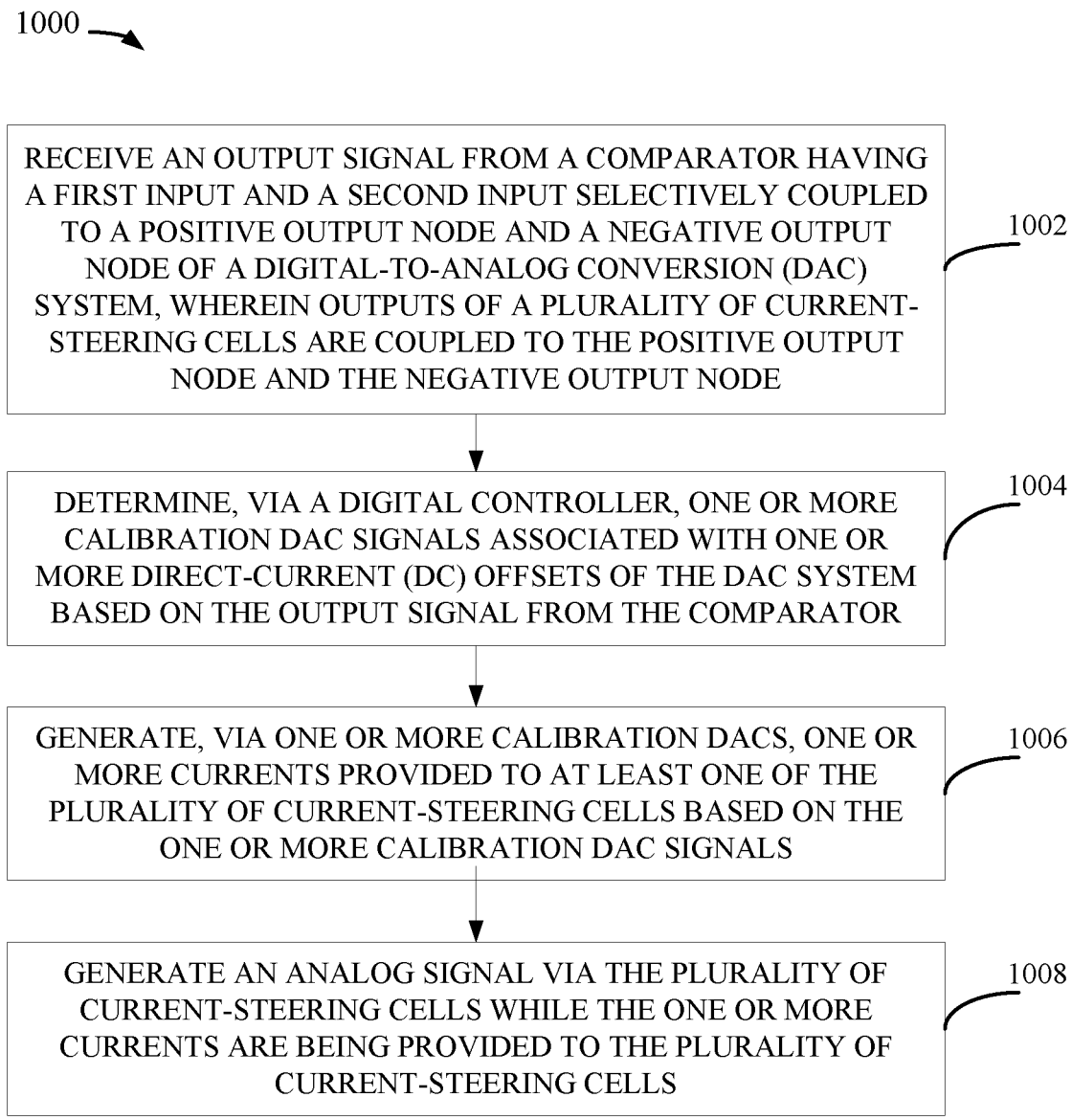
FIG. 10 is a flow diagram depicting example operations for digital-to-analog conversion, in accordance with certain aspects of the present disclosure.

FIG. 10 is a flow diagram depicting example operations 1000 for digital-to-analog conversion, in accordance with certain aspects of the present disclosure. For example, the operations 1000 may be performed by a DAC circuit, such as the current-steering DAC circuit 500.

The operations 1000 may begin, at block 1002, with a DAC receiving an output signal from a comparator (e.g., comparator 508 of FIGS. 5 and 6) having a first input (e.g., positive input) and a second input (e.g., negative input) selectively coupled to a positive output node (e.g., positive output node 608 shown in FIG. 6) and a negative output node (e.g., negative output node 606 shown in FIG. 6) of the DAC. Outputs of a plurality of current-steering cells (e.g., MSB current-steering cells 506) in the DAC may be coupled to the positive output node and the negative output node.

At block 1004, the DAC circuit determines, via a digital controller (e.g., digital controller 510), one or more calibration DAC signals (e.g., dac_offset and comparator_offset) associated with one or more DC offsets of the DAC circuit based on the output signal from the comparator. The one or more calibration DAC signals may be determined based on the output signal of the comparator using a digital controller configured to perform a binary search algorithm (e.g., SAR algorithm).

At block 1006, the DAC circuit generates, via one or more calibration DACs (e.g., calibration DAC 802 shown in FIG. 8), one or more currents (e.g., Ib_p and Ib_n shown in FIG. 8) provided to at least one of the plurality of current-steering cells based on the one or more calibration DAC signals. At block 1008, the DAC circuit generates an analog signal via the plurality of current-steering cells while the one or more currents are being provided to the plurality of current-steering cells.

In some aspects, determining the one or more calibration DAC signals includes determining a first calibration DAC signal (e.g., dac_save1 described with respect to FIG. 7A) when the positive output node is coupled to the first input of the comparator and the negative output node is coupled to the second input of the comparator, and determining a second calibration DAC signal (e.g., dac_save2 described with respect to FIG. 7B) when the negative output node is coupled to the first input of the comparator and the positive output node is coupled to the second input of the comparator. The first calibration DAC signal and the second calibration DAC signal may be determined based on the output signal of the comparator using a digital controller configured to perform a binary search algorithm (e.g., SAR algorithm).

The plurality of current-steering cells may include LSB current-steering cells (e.g., current-steering cells 504) and MSB current-steering cells (e.g., current-steering cells 506). The one or more calibration DACs may include a calibration DAC for each of the MSB current-steering cells. A resistor ladder circuit (e.g., resistor ladder circuit 402) may be coupled between an output of the LSB current-steering cells and the comparator.

In some aspects, each of the plurality of current-steering cells includes: a current source (e.g., transistor 804 and/or transistor 806), a first current-steering switch (e.g., current-steering switch 808) coupled to the current source; a second current-steering switch (e.g., current-steering switch 810) coupled to the current source; a first cascode transistor (e.g., cascode transistor 812) coupled to the first current-steering switch; and a second cascode transistor (e.g., cascode transistor 814) coupled to the second current-steering switch. Generating the one or more currents may include: generating a first current (e.g., Ib_p) provided to a node (e.g., node 816) between the first current-steering switch and the first cascode transistor; and generating a second current (e.g., Ib_n) provided to a node (e.g., node 818) between the second current-steering switch and the second cascode transistor, an amount of the first current being different than an amount of the second current. In some aspects, a drain of the first cascode transistor is coupled to the positive output node, and a drain of the second cascode transistor is coupled to the negative output node.

In some aspects, each of the one or more calibration DACs includes at least two current sources (e.g., transistors 922, 924 or transistors 954), each current source being coupled to at least two current-steering switches. Generating the one or more currents may include controlling the at least two current-steering switches (e.g., current-steering switches 926, 928, 930, 932 or current-steering switches 970, 972, 974, 976, 978, 980, 982, 984) based on the one or more calibration DAC signals. In some aspects, the DAC circuit may provide a first current via a first current source of the at least two current sources; and provide a second current via a second current source of the at least two current sources. In some aspects, the first current source and the second current source may have the same size or different sizes. For example, an amount of the first current (e.g., provided by an 8X transistor of calibration circuitry 952) may be different than an amount of the second current (e.g., provided by a 1× transistor of the calibration circuitry 952).

Example Aspects

Aspect 1. A digital-to-analog converter (DAC) circuit, comprising: a decoder coupled to an input of the DAC circuit; current-steering cells coupled to an output of the decoder, wherein outputs of the current-steering cells are coupled to a positive output node and a negative output node of the DAC circuit; and an offset detection circuit comprising: a comparator having a first input and a second input selectively coupled to the positive output node and the negative output node; and a digital controller having an input coupled to an output of the comparator and an output coupled to the decoder; and one or more calibration DACs coupled between the offset detection circuit and one or more of the current-steering cells.

Aspect 2. The DAC circuit of aspect 1, wherein the offset detection circuit further comprises: a first switch coupled between the positive output node and the first input of the comparator; a second switch coupled between the negative output node and the second input of the comparator; a third switch coupled between the positive output node and the second input of the comparator; and a fourth switch coupled between the negative output node and the first input of the comparator.

Aspect 3. The DAC circuit of any one of aspects 1-2, wherein the digital controller is configured to: determine a first calibration DAC signal associated with a first direct-current (DC) offset of the DAC circuit when the positive output node is coupled to the first input of the comparator and the negative output node is coupled to the second input of the comparator; determine a second calibration DAC signal associated with a second DC offset of the DAC circuit when the negative output node is coupled to the first input of the comparator and the positive output node is coupled to the second input of the comparator; and control at least one of the one or more calibration DACs based on the first DC offset and the second DC offset.

Aspect 4. The DAC circuit of aspect 3, wherein the digital controller is configured to determine the first calibration DAC signal and the second calibration DAC signal based on an output signal of the comparator using a digital controller configured to perform a binary search algorithm.

Aspect 5. The DAC circuit of any one of aspects 1-4, wherein the digital controller is configured to determine one or more calibration DAC signals associated with one or more DC offsets of the DAC circuit based on an output signal of the comparator using a digital controller configured to perform a binary search algorithm.

Aspect 6. The DAC circuit of any one of aspects 1-5, wherein: the current-steering cells include least significant bit (LSB) current-steering cells and most significant bit (MSB) current-steering cells; and the one or more calibration DACs include a calibration DAC for each of the MSB current-steering cells.

Aspect 7. The DAC circuit of aspect 6, further comprising a resistor ladder circuit coupled between outputs of the LSB current-steering cells and the first and second inputs of the comparator.

Aspect 8. The DAC circuit of any one of aspects 1-7, wherein each of the current-steering cells includes: a current source; a first current-steering switch coupled to the current source; a second current-steering switch coupled to the current source; a first cascode transistor coupled to the first current-steering switch; and a second cascode transistor coupled to the second current-steering switch.

Aspect 9. The DAC circuit of aspect 8, wherein: a first output of one of the calibration DACs is coupled to a first node between the first current-steering switch and the first cascode transistor; and a second output of one of the calibration DACs is coupled to a second node between the second current-steering switch and the second cascode transistor.

Aspect 10. The DAC circuit of any one of aspects 8-9, wherein at least one of the one or more calibration DACs is configured to: source a first current to a first node between the first current-steering switch and the first cascode transistor; and source a second current to a second node between the second current-steering switch and the second cascode transistor, an amount of the first current being different than an amount of the second current.

Aspect 11. The DAC circuit of any one of aspects 8-10, wherein: a drain of the first cascode transistor is coupled to the positive output node; and a drain of the second cascode transistor is coupled to the negative output node.

Aspect 12. The DAC circuit of any one of aspects 1-11, wherein each of the one or more calibration DACs includes at least two current sources, each coupled to at least two current-steering switches.

Aspect 13. The DAC circuit of aspect 12, wherein the digital controller is configured to determine one or more calibration DAC signals associated with one or more DC offsets of the DAC circuit and wherein the at least two current-steering switches are controlled based on the one or more calibration DAC signals.

Aspect 14. The DAC circuit of any one of aspects 12-13, wherein the at least two current sources have different sizes.

Aspect 15. A method for digital-to-analog conversion, comprising: receiving an output signal from a comparator having a first input and a second input selectively coupled to a positive output node and a negative output node of a digital-to-analog conversion (DAC) circuit, wherein outputs of a plurality of current-steering cells are coupled to the positive output node and the negative output node; determining, via a digital controller, one or more calibration DAC signals associated with one or more direct-current (DC) offsets of the DAC circuit based on the output signal from the comparator; generating, via one or more calibration DACs, one or more currents provided to at least one of the plurality of current-steering cells based on the one or more calibration DAC signals; and generating an analog signal via the plurality of current-steering cells while the one or more currents are being provided to the plurality of current-steering cells.

Aspect 16. The method of aspect 15, wherein determining the one or more calibration DAC signals includes: determining a first calibration DAC signal when the positive output node is coupled to the first input of the comparator and the negative output node is coupled to the second input of the comparator; and determining a second calibration DAC signal when the negative output node is coupled to the first input of the comparator and the positive output node is coupled to the second input of the comparator.

Aspect 17. The method of aspect 16, wherein the first calibration DAC signal and the second calibration DAC signal are determined based on the output signal of the comparator using a digital controller configured to perform a binary search algorithm.

Aspect 18. The method of any one of aspects 15-17, wherein the one or more calibration DAC signals are determined based on the output signal of the comparator using a digital controller configured to perform a binary search algorithm.

Aspect 19. The method of any one of aspects 15-18, wherein: the plurality of current-steering cells includes least significant bit (LSB) current-steering cells and most significant bit (MSB) current-steering cells; and the one or more calibration DACs include a calibration DAC for each of the MSB current-steering cells.

Aspect 20. The method of any one of aspects 15-19, wherein each of the plurality of current-steering cells includes: a current source; a first current-steering switch coupled to the current source; a second current-steering switch coupled to the current source; a first cascode transistor coupled to the first current-steering switch; and a second cascode transistor coupled to the second current-steering switch.

Aspect 21. The method of aspect 20, wherein generating the one or more currents includes: generating a first current provided to a node between the first current-steering switch and the first cascode transistor; and generating a second current provided to a node between the second current-steering switch and the second cascode transistor, an amount of the first current being different than an amount of the second current.

Aspect 22. The method of any one of aspects 15-21, wherein each of the one or more calibration DACs includes at least two current sources, each current source being coupled to at least two current-steering switches.

Aspect 23. The method of aspect 22, wherein generating the one or more currents comprises controlling the at least two current-steering switches based on the one or more calibration DAC signals.

Aspect 24. The method of any one of aspects 22-23, further comprising: providing a first current via a first current source of the at least two current sources; and providing a second current via a second current source of the at least two current sources, an amount of the first current being different than an amount of the second current.

Aspect 25. An apparatus for digital-to-analog conversion, comprising: means for determining one or more calibration digital-to-analog converter (DAC) signals associated with one or more direct-current (DC) offsets of a DAC circuit based on an output signal from a comparator, the comparator having a first input and a second input selectively coupled to a positive output node and a negative output node of the DAC circuit, wherein outputs of a plurality of current-steering cells of the DAC circuit are coupled to the positive output node and the negative output node; and means for generating one or more currents to be provided to at least one of the plurality of current-steering cells based on the one or more calibration DAC signals, wherein the current-steering cells are configured to generate an analog signal while the one or more currents are provided to the plurality of current-steering cells.

ADDITIONAL CONSIDERATIONS

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112 (f) unless the element is expressly recited using the phrase "means for" or, in the case of a method claim, the element is recited using the phrase "step for." For example, means for determining may include a digital controller, such as digital controller 510. Means for generating one or more currents may include a calibration DAC, such as the calibration DAC 802.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A digital-to-analog converter (DAC) circuit, comprising:
   a decoder coupled to an input of the DAC circuit;
   current-steering cells coupled to an output of the decoder, wherein outputs of the current-steering cells are coupled to a positive output node and a negative output node of the DAC circuit; and
   an offset detection circuit comprising:
      a comparator having a first input and a second input selectively coupled to the positive output node and the negative output node; and
      a digital controller having an input coupled to an output of the comparator and an output coupled to the decoder; and
   one or more calibration DACs coupled between the offset detection circuit and one or more of the current-steering cells.

2. The DAC circuit of claim 1, wherein the offset detection circuit further comprises:
   a first switch coupled between the positive output node and the first input of the comparator;
   a second switch coupled between the negative output node and the second input of the comparator;
   a third switch coupled between the positive output node and the second input of the comparator; and
   a fourth switch coupled between the negative output node and the first input of the comparator.

3. The DAC circuit of claim 1, wherein the digital controller is configured to:
   determine a first calibration DAC signal associated with a first direct-current (DC) offset of the DAC circuit when the positive output node is coupled to the first input of the comparator and the negative output node is coupled to the second input of the comparator;
   determine a second calibration DAC signal associated with a second DC offset of the DAC circuit when the negative output node is coupled to the first input of the comparator and the positive output node is coupled to the second input of the comparator; and
   control at least one of the one or more calibration DACs based on the first DC offset and the second DC offset.

4. The DAC circuit of claim 3, wherein the digital controller is configured to determine the first calibration DAC signal and the second calibration DAC signal based on an output signal of the comparator using a digital controller configured to perform a binary search algorithm.

5. The DAC circuit of claim 1, wherein the digital controller is configured to determine one or more calibration DAC signals associated with one or more DC offsets of the DAC circuit based on an output signal of the comparator using a digital controller configured to perform a binary search algorithm.

6. The DAC circuit of claim 1, wherein:
   the current-steering cells include least significant bit (LSB) current-steering cells and most significant bit (MSB) current-steering cells; and
   the one or more calibration DACs include a calibration DAC for each of the MSB current-steering cells.

7. The DAC circuit of claim 6, further comprising a resistor ladder circuit coupled between outputs of the LSB current-steering cells and the first and second inputs of the comparator.

8. The DAC circuit of claim 1, wherein each of the current-steering cells includes:
a current source;
a first current-steering switch coupled to the current source;
a second current-steering switch coupled to the current source;
a first cascode transistor coupled to the first current-steering switch; and
a second cascode transistor coupled to the second current-steering switch.

9. The DAC circuit of claim 8, wherein:
a first output of one of the calibration DACs is coupled to a first node between the first current-steering switch and the first cascode transistor; and
a second output of one of the calibration DACs is coupled to a second node between the second current-steering switch and the second cascode transistor.

10. The DAC circuit of claim 8, wherein at least one of the one or more calibration DACs is configured to:
source a first current to a first node between the first current-steering switch and the first cascode transistor; and
source a second current to a second node between the second current-steering switch and the second cascode transistor, an amount of the first current being different than an amount of the second current.

11. The DAC circuit of claim 8, wherein:
a drain of the first cascode transistor is coupled to the positive output node; and
a drain of the second cascode transistor is coupled to the negative output node.

12. The DAC circuit of claim 1, wherein each of the one or more calibration DACs includes at least two current sources, each coupled to at least two current-steering switches.

13. The DAC circuit of claim 12, wherein the digital controller is configured to determine one or more calibration DAC signals associated with one or more DC offsets of the DAC circuit and wherein the at least two current-steering switches are controlled based on the one or more calibration DAC signals.

14. The DAC circuit of claim 12, wherein the at least two current sources have different sizes.

15. A method for digital-to-analog conversion, comprising:
receiving an output signal from a comparator having a first input and a second input selectively coupled to a positive output node and a negative output node of a digital-to-analog conversion (DAC) circuit, wherein outputs of a plurality of current-steering cells are coupled to the positive output node and the negative output node;
determining, via a digital controller, one or more calibration DAC signals associated with one or more direct-current (DC) offsets of the DAC circuit based on the output signal from the comparator;
generating, via one or more calibration DACs, one or more currents provided to at least one of the plurality of current-steering cells based on the one or more calibration DAC signals; and
generating an analog signal via the plurality of current-steering cells while the one or more currents are being provided to the plurality of current-steering cells.

16. The method of claim 15, wherein determining the one or more calibration DAC signals includes:
determining a first calibration DAC signal when the positive output node is coupled to the first input of the comparator and the negative output node is coupled to the second input of the comparator; and
determining a second calibration DAC signal when the negative output node is coupled to the first input of the comparator and the positive output node is coupled to the second input of the comparator.

17. The method of claim 16, wherein the first calibration DAC signal and the second calibration DAC signal are determined based on the output signal of the comparator using a digital controller configured to perform a binary search algorithm.

18. The method of claim 15, wherein the one or more calibration DAC signals are determined based on the output signal of the comparator using a digital controller configured to perform a binary search algorithm.

19. The method of claim 15, wherein:
the plurality of current-steering cells includes least significant bit (LSB) current-steering cells and most significant bit (MSB) current-steering cells; and
the one or more calibration DACs include a calibration DAC for each of the MSB current-steering cells.

20. The method of claim 15, wherein each of the plurality of current-steering cells includes:
a current source;
a first current-steering switch coupled to the current source;
a second current-steering switch coupled to the current source;
a first cascode transistor coupled to the first current-steering switch; and
a second cascode transistor coupled to the second current-steering switch.

21. The method of claim 20, wherein generating the one or more currents includes:
generating a first current provided to a node between the first current-steering switch and the first cascode transistor; and
generating a second current provided to a node between the second current-steering switch and the second cascode transistor, an amount of the first current being different than an amount of the second current.

22. The method of claim 15, wherein each of the one or more calibration DACs includes at least two current sources, each current source being coupled to at least two current-steering switches.

23. The method of claim 22, wherein generating the one or more currents comprises controlling the at least two current-steering switches based on the one or more calibration DAC signals.

24. The method of claim 22, further comprising:
providing a first current via a first current source of the at least two current sources; and
providing a second current via a second current source of the at least two current sources, an amount of the first current being different than an amount of the second current.

25. An apparatus for digital-to-analog conversion, comprising:
means for determining one or more calibration digital-to-analog converter (DAC) signals associated with one or more direct-current (DC) offsets of a DAC circuit based on an output signal from a comparator, the comparator having a first input and a second input selectively coupled to a positive output node and a negative output node of the DAC circuit, wherein outputs of a plurality of current-steering cells of the DAC circuit are coupled to the positive output node and the negative output node; and means for generating one or more currents to be provided to at least one of the plurality of current-steering cells based on the one or more calibration DAC signals, wherein the current-steering cells are configured to generate an analog signal while the one or more currents are provided to the plurality of current-steering cells.

* * * * *